(12) United States Patent
Okayasu

(10) Patent No.: US 6,586,953 B1
(45) Date of Patent: Jul. 1, 2003

(54) OPTICALLY DRIVEN DRIVER, OPTICAL OUTPUT TYPE VOLTAGE SENSOR, AND IC TESTING EQUIPMENT USING THESE DEVICES

(75) Inventor: Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/402,207

(22) PCT Filed: Feb. 5, 1998

(86) PCT No.: PCT/JP98/00478

§ 371 (c)(1),
(2), (4) Date: Sep. 29, 1999

(87) PCT Pub. No.: WO99/40449

PCT Pub. Date: Aug. 12, 1999

(51) Int. Cl.⁷ .................. G01R 31/308; G01R 31/00; G01R 31/28
(52) U.S. Cl. .................. 324/753; 324/96; 714/724
(58) Field of Search .................. 324/753, 750, 324/96; 250/227.11, 559.45, 559.46; 385/14, 3; 714/724, 734, 735, 738

(56) References Cited

U.S. PATENT DOCUMENTS

| | | | |
|---|---|---|---|
| 4,870,295 A | | 9/1989 | Rauscher |
| 5,074,631 A | * | 12/1991 | Hamano et al. ............... 385/3 |
| 5,137,359 A | * | 8/1992 | Steele ............... 385/14 |
| 5,153,442 A | | 10/1992 | Bovino et al. |
| 5,347,601 A | * | 9/1994 | Ade et al. ............... 385/14 |
| 5,654,812 A | * | 8/1997 | Suzuki ............... 359/139 |
| 5,767,955 A | * | 6/1998 | Konno et al. ............... 324/534 |
| 5,781,003 A | * | 7/1998 | Kondo ............... 324/750 |
| 5,821,529 A | | 10/1998 | Chihara et al. ............... 250/214.1 |
| 6,285,182 B1 | * | 9/2001 | Blake et al. ............... 324/753 |

FOREIGN PATENT DOCUMENTS

| | | | |
|---|---|---|---|
| DE | 19714941 | 11/1997 | |
| EP | 0668507 | 8/1995 | |
| EP | 0758090 | 2/1997 | |
| JP | 58216969 | 12/1983 | |
| JP | 59155764 | 9/1984 | |
| JP | 59218915 | 12/1984 | |
| JP | 61117472 | 6/1986 | |
| JP | 6237940 | 2/1987 | |
| JP | 6478169 | 3/1989 | |
| JP | 2066476 | 6/1990 | |
| JP | 2249977 | 10/1990 | |
| JP | 3-65987 | 6/1991 | |
| JP | 4188087 | 7/1992 | |
| JP | 5273315 | 10/1993 | |
| JP | 10115644 A | * 10/1996 | ........... G01R/29/08 |
| JP | 9257875 | 3/1997 | |
| JP | 9-89961 | 4/1997 | |
| WO | WO 9635972 | 11/1996 | |
| WO | WO 9803895 | 1/1998 | |

* cited by examiner

Primary Examiner—Kamand Cuneo
Assistant Examiner—Jermele Hollington
(74) Attorney, Agent, or Firm—David N. Lathrop, Esq.; Gallagher & Lathrop

(57) ABSTRACT

An IC testing apparatus has a mainframe that includes a waveform generator, logic comparator, optical signal converter and photodector, and has a test head that includes an optical driver and optical output type voltage sensor. The optical signal converter converts a test pattern signal from the waveform generator into an optical signal that is sent to the test head through an optical waveguide to the optical driver. The optical driver converts the optical signal into an electric signal, which is applied to an IC under test in the test head. The optical output type voltage sensor converts a response signal received from the IC under test into an optical signal that is sent through an optical waveguide to the photodector, which converts it into an electrical signal for the logic comparator to compare so that the IC response can be assessed.

17 Claims, 16 Drawing Sheets

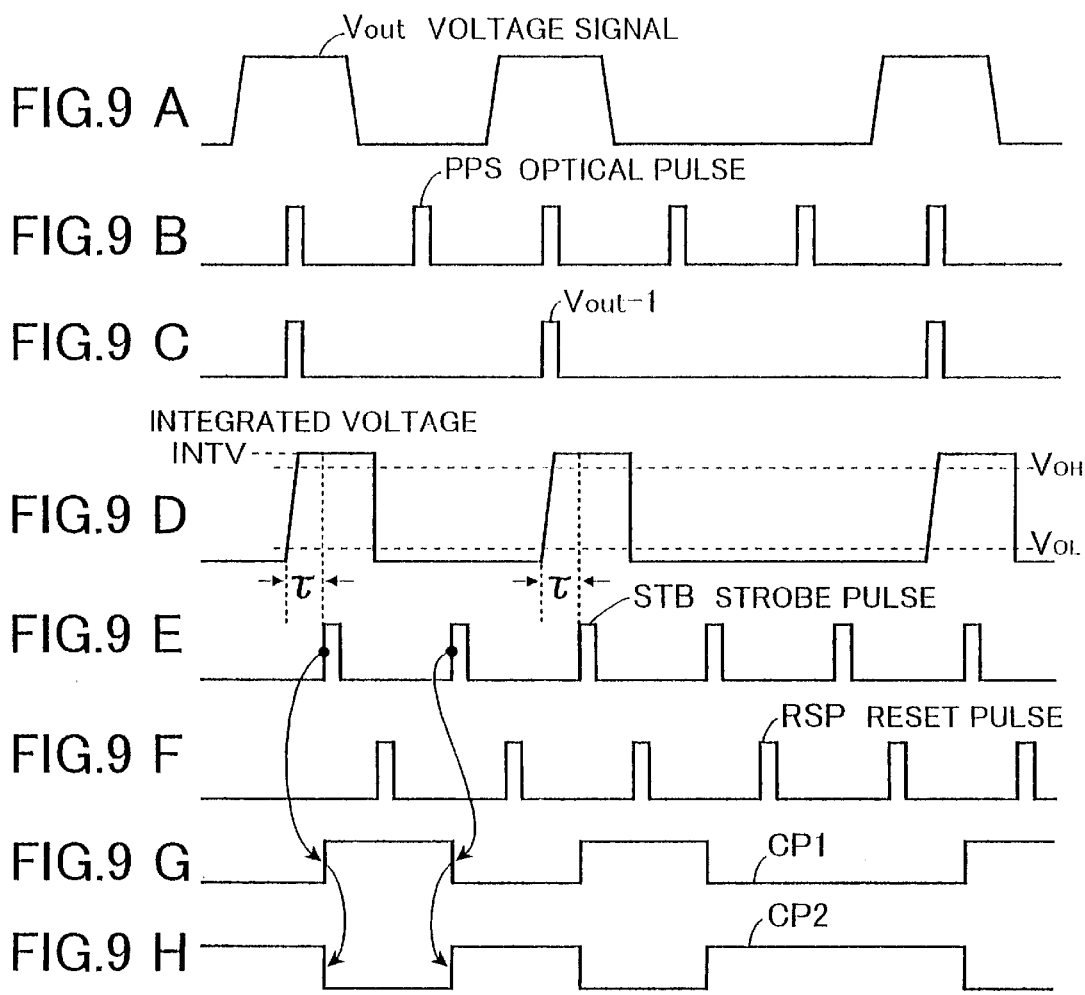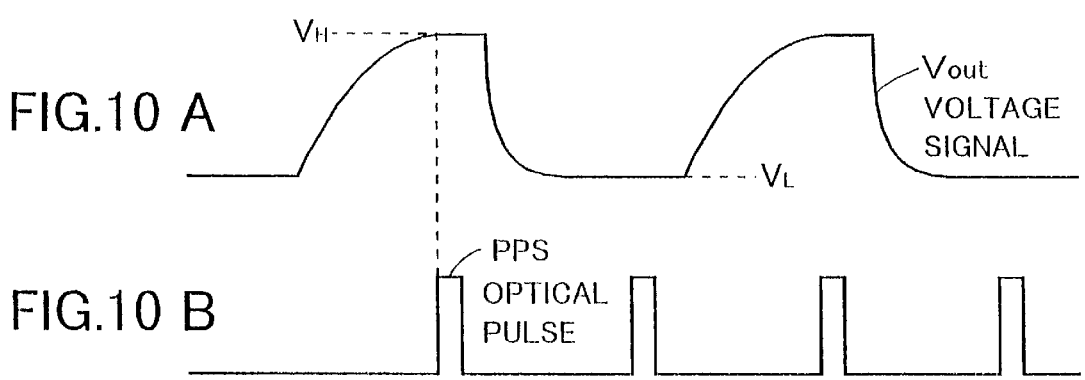

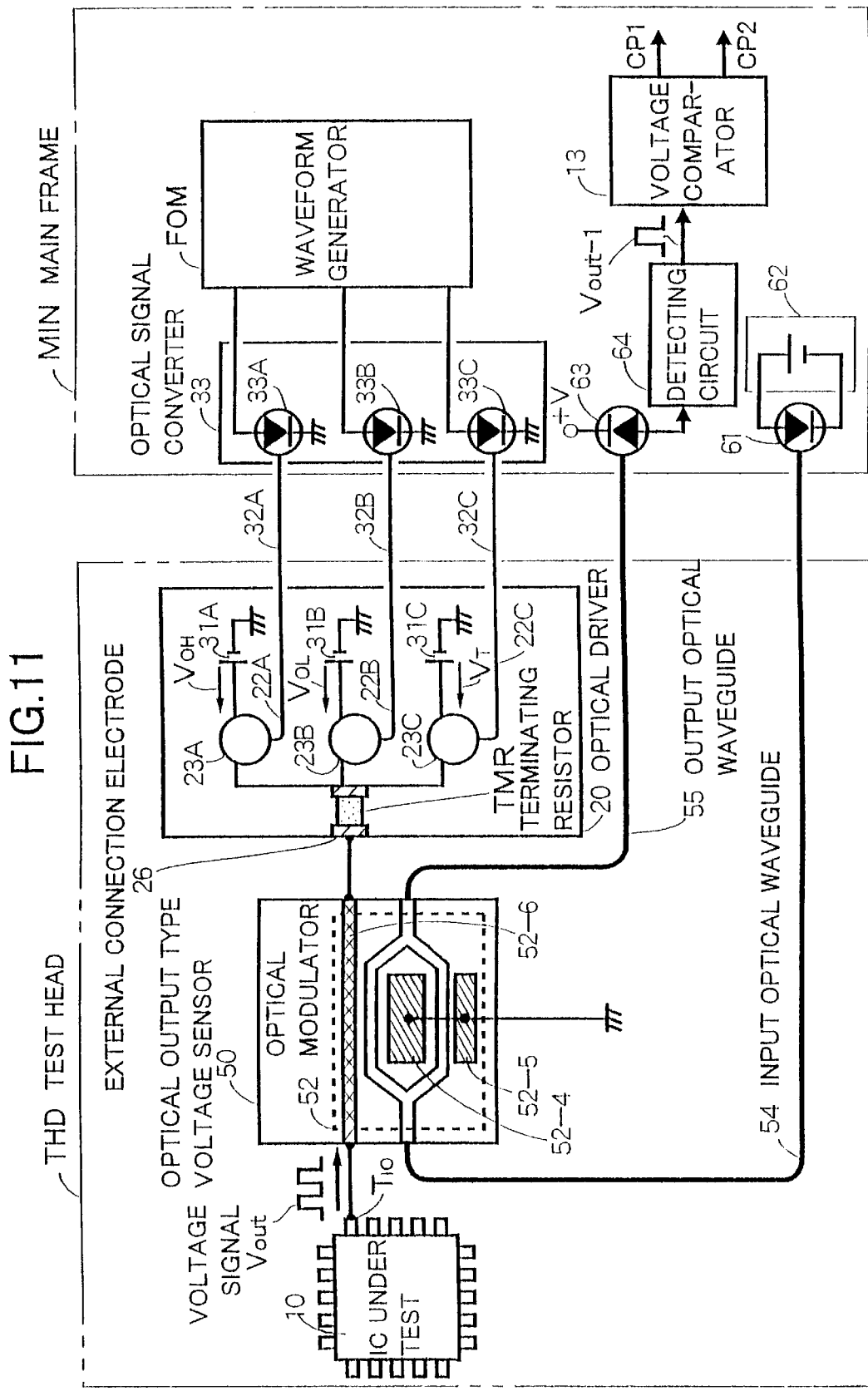

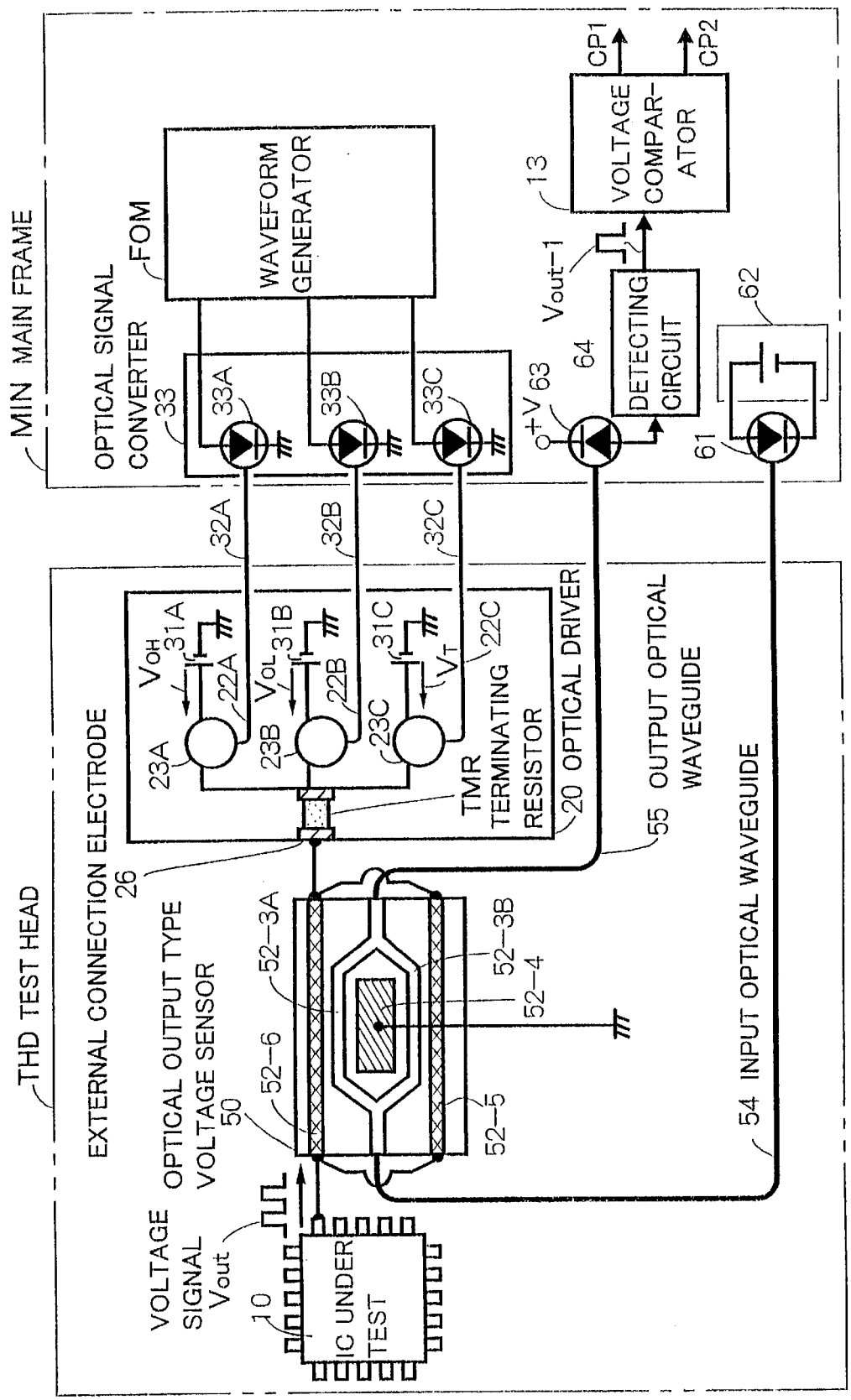

OPTICALLY DRIVEN DRIVER, OPTICAL OUTPUT TYPE VOLTAGE SENSOR, AND IC TESTING EQUIPMENT USING THESE DEVICES

TECHNICAL FIELD

The present invention relates to an optical driver which is driven by an optical signal to generate a voltage signal for the application of a test pattern signal to an IC under test, an optical output type voltage sensor which outputs its detected voltage as an optical signal for the transmission of an analog amount corresponding to a measured voltage value, and an IC testing apparatus using them.

BACKGROUND ART

FIG. 15 illustrates the general construction of a conventional IC testing apparatus. The IC testing apparatus in common use comprises, as depicted in FIG. 15, a test head THD, a mainframe MIN with the testing device proper stored therein, a cable KBL interconnecting them, and an auto-handler HND for feeding an IC under test 10 to the test head THD on a fully automatic basis.

The illustrated prior art example adopts a system configuration wherein: an IC socket SK is mounted on the test head THD; the IC under test 10 is held in contact with the IC socket SK for electrical connection with the mainframe MIN through the cable KBL; a test pattern signal is applied from the mainframe MIN to the IC under test 10 via the cable KBL; and a response signal of the IC under test 10 is fed via the cable KBL to the mainframe MIN; the response signal and an expectation are subjected to logical comparison in the mainframe MIN to determine whether the IC under test 10 is in normal operation, thereby conducting its quality evaluation.

In association with the test head THD there is placed the auto-handler HND which automatically transfers the IC under test 10. The auto-handler HND conducts fully automatic operations of engaging the IC under test 10 with the IC socket S, and after completion of the test, disengaging the tested IC from the IC socket SK, then classifying the tested IC 10 as nondefective or defective according to test conclusions, and putting it in the storage cabinet concerned.

Because of the necessity of automatically feeding the IC under test 10 to the test head THD by the auto-handler HND as described above, the IC testing apparatus is forced to adopt a system configuration that the test head THD is placed apart from the mainframe MIN and electrically connected thereto by the cable KBL.

FIG. 16 depicts a general configuration of an electrical system in the IC testing apparatus. In the mainframe MIN there are housed a pattern generator PG, a timing generator TG, a waveform generator FOM, a logic comparator LOG, and so forth. The pattern generator PG outputs test pattern data PGDT to the waveform generator FOM. The waveform generator FOM generates a test pattern signal PGSIG of a waveform whose H and L logic are defined by the test pattern data PGDT fed from the pattern generator PG and whose rise and fall timing of the H and L logic are defined according to timing data that is provided from the timing generator TG. The test pattern signal PGSIG is generated for each input terminal $T_{IN}$ of the IC under test 10, and is provided via the cable KBL and a driver 12 to every input terminal $T_{IN}$ of the IC under test 10.

When the IC under test 10 is, for instance, a memory, data is once written in each address of the IC under test 10 using the test pattern signal PGSIG, and then data is read out from each address to an output terminal $T_{out}$. The response signal thus read out to the output terminal $T_{out}$ is decided by comparators 13A and 13B of a voltage comparator 13 as to whether it has a predetermined H logic level and a predetermined L logic level, and the decision results are sent as CP1 and CP2 to the mainframe MIN via the cable KBL.

A brief description will be given, with reference to FIGS. 17A to 17D of operations of the comparators 13A and 13B. FIG. 17A depicts the waveform of a response signal $V_{out}$ of the IC under test 10 read out to the output terminal $T_{out}$. The comparators 13A and 13B are supplied with a strobe pulse STR from the mainframe MIN which is generated by the timing generator TG, and output the voltage comparison results CP1 and CP" in synchronization with the strobe pulse STR.

That is, at the conclusion of an elapsed time TDRY from the start of outputting the response signal $V_{out}$ to the settling of its waveform, the strobe pulse STR is applied to the comparators 13A and 13B to cause it to output the comparison results CP1 and CP2. The comparator 13A is supplied with a comparison voltage $V_{OH}$ that defines the normal H logic level. The comparator 13B is supplied with a comparison voltage $V_{OL}$ that defines the normal L logic. When the H logic of the response signal Vout is further positive than the comparison voltage $V_{OH}$, the comparator 13A outputs, as a test conclusion, the H-logic comparison result CP1 that represents nondefectiveness. When the L logic of the response signal $V_{out}$ is further negative than the voltage $V_{OL}$ that defines the normal L logic, the voltage comparator 13B outputs the H-logic comparison result CP2 that represents nondefectiveness.

The comparison results CP1 and CP2 provided from the comparators 13A and 13B are sent via the cable KBL to the mainframe MIN and are subjected to a logical comparison with an expectation pattern NPG by means of a logic comparator LOG disposed in the mainframe MIN; the quality of the IC under test 10 is decided, depending on whether a mismatch is found in the logic comparator LOG.

Incidentally, there are connected to the output terminal Tout of the IC under test 10 a terminating resistor TMR for impedance matching use and a DC power supply 14 that has a terminating voltage value VT which is determined by the specifications of the IC under test 10. FIG. 16 depicts the case where the IC under test 10 is an IC of the type having its input terminals $T_{IN}$ and output terminal $T_{out}$ provided independently of each other, but cases are also often met with that the input terminal and the output terminal share one pin. On this account, as depicted in FIG. 18, the output of each driver DR of the driver 12 and the input terminals of the comparators 13A and 13B of the voltage comparator 13 are connected together to each input/output terminal $T_{IO}$ of the IC under test 10. In this instance, a terminating resistor TMR is connected in series between the output terminal of each driver and its common connection point of the comparators 13A and 13B; in a mode in which to read out of the IC under test 10 the test pattern signal (data) written therein, the driver is caused to output a terminating voltage VT, then the potential level of the voltage signal $V_{out}$ read out of the IC under test 10 in a state in which the terminating condition of the IC under test 10 is satisfied, is subjected to the comparison by the comparators 13A and 13B, and the comparison results CP1 and CP2 are sent into the mainframe MIN.

It will be understood from the above that the IC testing apparatus has a configuration wherein the test head THD and the mainframe MIN are separated from each other and are electrically connected by the cable KBL.

Incidentally, users of IC testing apparatus call for testing quantities of ICs in a short time. To meet this requirement, the auto-handler HND and the test head THD are forced to become large-scale and bulky, and consequently, the length of the cable KBL is on the increase.

With an increase in the length of the longer the cable KBL, electro-magnetically induced noise becomes more likely to get mixed in the signal transmitted over the cable and the signal also becomes more susceptible to a parasitic stray capacitance and a parasitic inductor of the cable KBL—this imposes limitations on the transmission rate (frequency) of signals that can be transmitted between the mainframe MIN and the test head THD; that is, the lengthening of the cable leads to the disadvantage of setting limits on high-speed IC testing. This is an insuperably serious obstacle associated with the use of the configuration that interconnects the test head THD and the mainframe MIN by all electrical transnmission line.

Another problem y arises from the construction that large quantities of electronic circuit elements such as the drivers 12 and the voltage comparators 13 are housed in the narrow space of the test head THD. And there is the recent trend that the number of ICs to be tested at a time increases to 16, 32 and 64. As the number of ICs to be tested at a time increases, the calorific value per unit space in the test head THD increases and temperature also rises remarkably—this requires devising a method for heat radiation and involves additional costs therefor.

A first object of the present invention is to propose an IC testing apparatus which permits dramatic improvements in the test speed, and an optical output type voltage sensor and an optical driver that are used to implement the IC testing apparatus.

A second object of the present invention is to propose an IC testing apparatus which reduces the calorific value in the test head and hence avoids the expenditure for heat radiation, and an optical output type voltage sensor and an optical driver that are used to implement the IC testing apparatus.

DISCLOSURE OF THE INVENTION

The present invention proposes an optical driver which interconnects the test head and the mainframe by an optical waveguide and sends a test pattern signal as an optical signal to the test head for applying the test pattern signal to the IC under test after conversion to an electric signal, and an optical output type voltage sensor which converts the response signal from the IC under test to an optical signal and sends the optical signal to the mainframe, and further proposes an IC testing apparatus using the optical driver and the optical output type voltage sensor.

Thus, according to the present invention, the test head and the mainframe are interconnected by an optical waveguide. The optical waveguide is free from the possibility of an electro-magnetically induced noise or similar electrical noise getting mixed thereinto. Further, since there is no influence of an electrostatic capacitance or parasitic inductor even if the optical waveguide is long, the frequency of the signal that is transmitted over the optical waveguide can make a dramatic leap upward as compared with the signal frequency in the IC testing apparatus using the electrical transmission line. Therefore, it is possible to realize the IC testing apparatus capable of high-speed testing.

BRIEF DESCRIPTION OF THE DRAWINGS

FIGS. 9A to 9H waveform diagrams for explaining the operation of the modification shown in FIG. 8.

FIGS. 10A and 10B are waveform diagrams similar to FIG. 9.

FIG. 11 is a connection diagram illustrating an embodiment of an IC testing apparatus that uses both the optical driver and the optical output type voltage sensor according to the present invention.

FIG. 12 is a connection diagram depicting a modified form of the FIG. 11 embodiment.

BEST MODE FOR CARRYING OUT THE INVENTION

Figure 1:
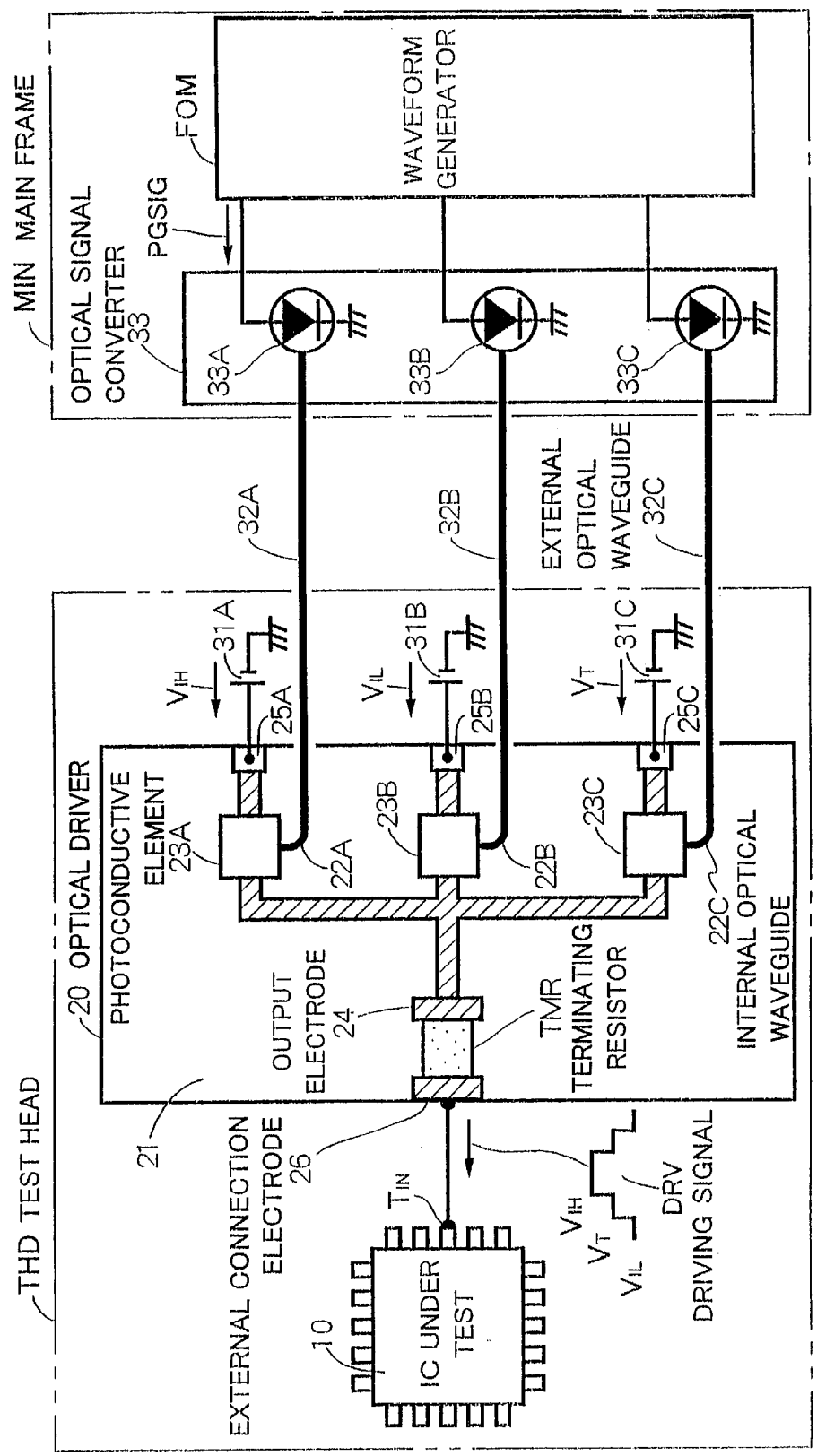
FIG. 1 is a connection diagram for explaining an embodiment of an IC testing apparatus that uses the optical driver according to the present invention.

FIG. 1 illustrates an embodiment of the optical driver according to the present invention. The embodiment depicted in FIG. 1 is a three-value driver capable of outputting the terminating voltage $V_T$ that is determined by voltages $V_{IH}$ and $V_{IL}$ and the specifications of the IC under test 10. Reference numeral 20 denotes the optical driver according to the present invention. The optical driver 20 can be made up of: a dielectric substrate 21 as of lithium niobate (LiNbO$_3$) in which internal optical waveguides 22A, 22B and 22C can be formed; the internal optical waveguides 22A, 22B and 22c formed in the dielectric substrate 21; photoconductive elements 23A, 23B and 23C optically coupled to the internal optical waveguides 22A, 22B and 22c at one end thereof, respectively; and input electrodes 25A, 25B and 25C electrically connected to an output electrode 24 by the photoconductive elements 23A, 23B and 23C, respectively.

Incidentally, the dielectric substrate 21 is shown to be provided with an electrode 26 for external connection use other than the output electrode 24 and the input electrodes 25A, 25B and 25C and a terminating resistor TMR formed between the external connection electrode 26 and the output electrode 24.

To the internal optical waveguides 22A, 22B and 22C formed in the dielectric substrate 21 there are optically coupled external optical waveguides 32A, 32B and 32C formed, for example, by optical fibers; and the other ends of the external optical waveguides 32A, 32B and 32C at the side of the mainframe MIN are comlected to an optical signal converter 33 by which the test pattern signal PGSIG from the waveform generator FOM is converted to an optical signal. The optical signal converter 33 comprises three light sources 33A, 33B and 33C provided for each input terminal of the IC under test 10, and lights the light sources 33A, 33B and 33C in response to the test pattern signals, thereby selectively activating the photoconductive elements 23A, 23B and 23C by light that the light sources 33A, 33B and 33C emit. By the selective conduction of the photoconductive elements 23A, 23B and 23C, any one of the voltages $V_{IH}$, $V_{IL}$ and $V_T$, which are provided to the input electrodes 25A, 25B and 25C, can be fed to the external connection electrode 26; thus, the three-valued drive signal DRV can be output.

With the configuration of the optical driver 20 according to the present invention, the optical driver 20 and voltage sources 31A, 31B and 31C are mounted in the test head THD, the light sources 33A, 33B and 33C are mounted in the mainframe MIN, and by transminttting the test pattern signals as optical signals from the mainframe MIN to the test head THD over the external optical waveguides 32A, 32B and 33C, tie three-valued drive signal DRV can be provided to the external-connection electrode 26. By applying the three-valued drive signal DRV to the IC under test 10, in the FIG. 1 example, via an input-only terninal $T_{IN}$, the test pattern signals can be input into the IC under test 10.

In the above, the photoconductive elements 23A, 23B and 23C may each be formed by an element of Si, GaAs, InAs, or similar semiconductor material which, when irradiated with light, exhibits photoconductivity by carriers that are generated by the optical input thereto. While in the above the internal optical waveguides 22A, 22B and 22C have been described to be formed on the dielectric substrate 21, they may also be formed by optical fibers like the external optical waveguides 32A, 32B and 32C. In this case, the optical fibers forming the internal optical waveguides 22A, 22B, 22C and the optical fibers forming the external optical waveguides 32A, 32B, 32C need to be adapted so that they are connected to and disconnected from each other by means of optical connectors.

Figure 2:
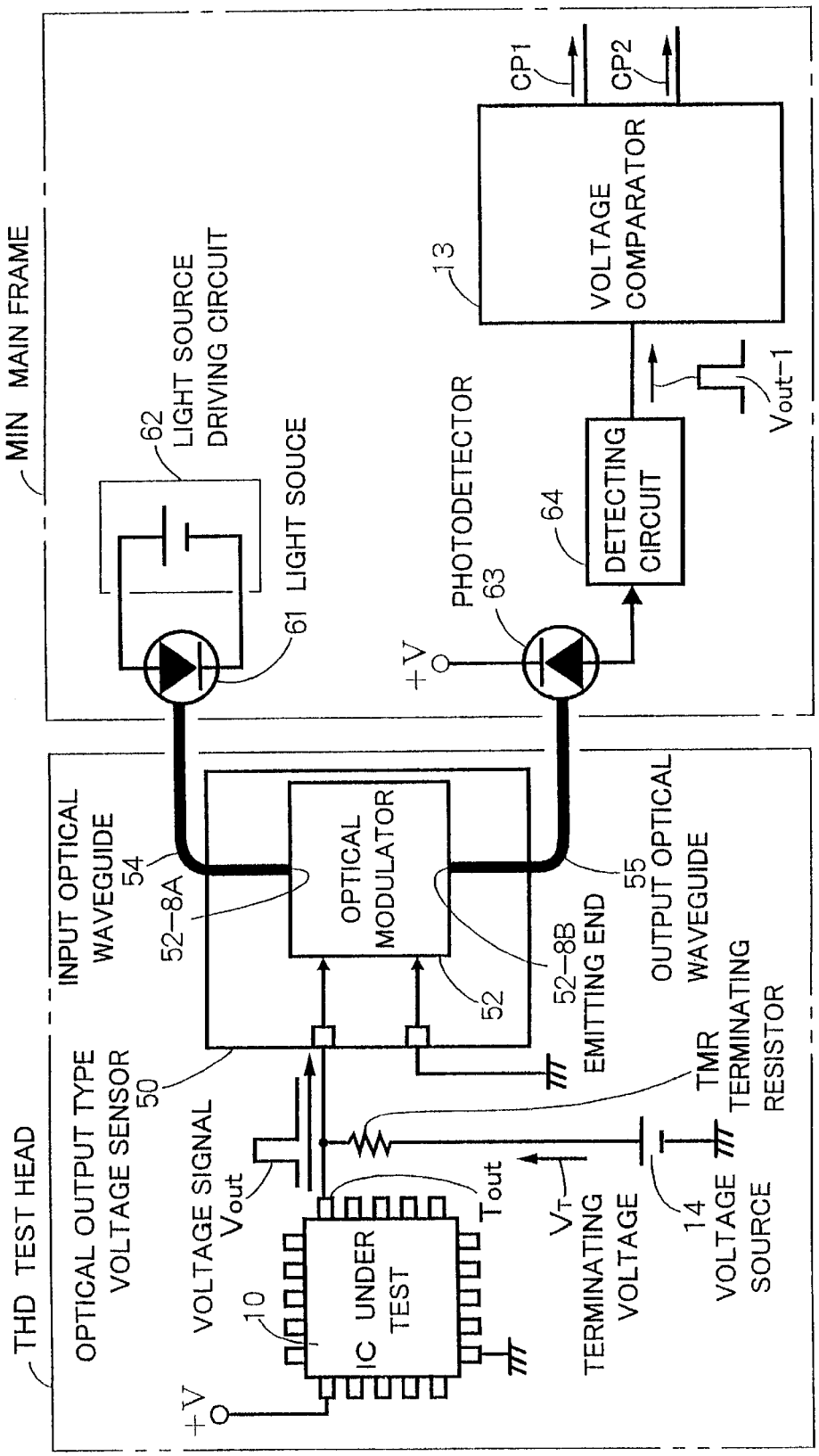
FIG. 2 is a connection diagram for explaining an embodiment of an IC testing apparatus that uses the optical output type voltage sensor according to the present invention.

FIG. 2 illustrates an embodiment of the IC testing apparatus that employs the optical output type voltage sensor according to the present invention. In this embodiment of FIG. 2, a voltage signal $V_{out}$ provided from an output-only terminal $T_{out}$ is converted to an optical signal and is transmitted to the mainframe MIN. In FIG. 2, reference numeral 50 denotes the optical output type voltage sensor according to the present invention. The optical output type voltage sensor according to the present invention can be made up of: a terminating resistor TMR which receives the voltage signal Vout from the IC under test 10 with an appropriate impedance; an optical modulator 52 that converts the voltage Vo of the voltage signal Vout received by the terminating resistor TMR into the quantity of light modulated and outputs interference light based on the quantity of light modulated; and a substrate 51 which supports them.

Figure 3:
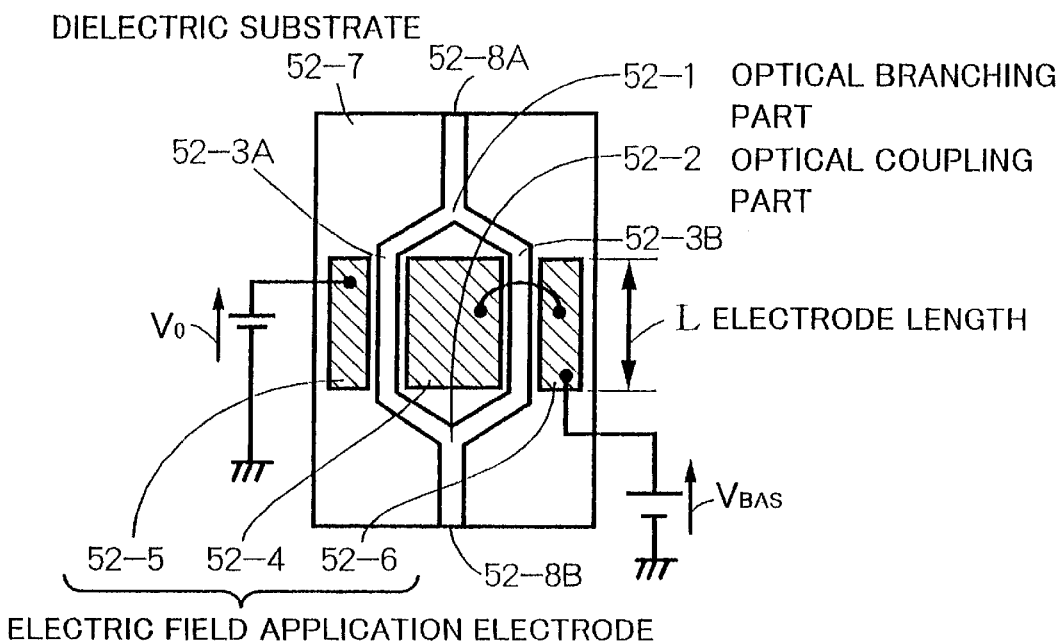
FIG. 3 is a plan view for explaining the configuration and operation of an optical modulator used in the embodiment of FIG. 2.

The optical modulator 52 comprises, as depicted in FIG. 3, an optical branching part 52-1 for branching the optical waveguide formed in the dielectric substrate 52-7, an optical coupling part 52-2, two optical waveguides 52-3A and 52-3B formed between the optical branching part 52-2 and the optical coupling part 52-2, and electric field application electrodes 52-4, 52-5 and 52-6 formed along both sides of the two optical waveguides 52-3A and 52-3B.

The optical branching part 52-1, the optical coupling part 52-2 and the optical waveguides 52-3A and 52-3B can be formed, for example, by diffusing titanium or the like into the dielectric substrate 52-7 made as of lithium niobate ($LiNbO_3$). Optical fibers or similar optical waveguides 54 and 55 are optically coupled to a light receiving end 52-8A and a light emitting end 52-8B exposed on opposite end faces of the dielectric substrate 52-7; a laser diode or similar light source 61 is coupled to the other end of the input optical waveguide coupled to the light receiving end 52-8A, and a photodetector 63, such as a photodiode, is coupled to the other end of the output optical waveguide 55 coupled to the light emitting end 52-8B 63.

The light source 61 is lit be being driven by a light source driving circuit 62. In this example, the light source is shown to be driven by a DC power supply. Accordingly, the light source 61 launches a fixed quantity of laser light into the input optical waveguide 54. The photodetector 63 is connected to a detecting circuit 64, from which the intensity of light emitted from the output optical waveguide 55 is derived as a voltage signal $V_{out-1}$. A voltage $V_0$ that is developed across the terminating resistor TRM is applied across one of the pairs of electric field application electrodes 52-4, 52-5 and 52-6. The example of FIG. 3 shows the case where the voltage $V_0$ developed across the terminating resistor TMR is applied across the electric field application electrodes 52-4 and 52-5 but no electric field is applied across the electric field application electrodes 52-4 and 52-6 of the other pair which are connected together. By applying an electric field to the one optical waveguide 52-3A but no electric field to the other optical waveguide 52-3B, light is phase modulated in the optical waveguide 52-3A applied the electric field but no optical modulation takes place in the optical waveguide 52-3B applied no electric field. Owing to the phase modulation of light in the optical waveguide 52-3A, interference of light occurs in the optical coupling part 52-2, causing variations in the intensity of light that is emitted to the output optical waveguide 55.

Figure 4:
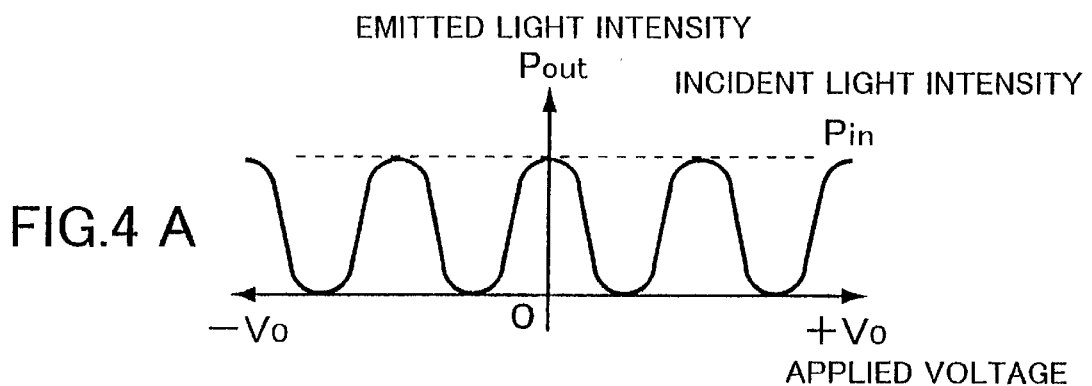
FIGS. 4A and 4B are waveform diagrams for explaining the operation of the optical modulator depicted in FIG. 3.
Figure 4:
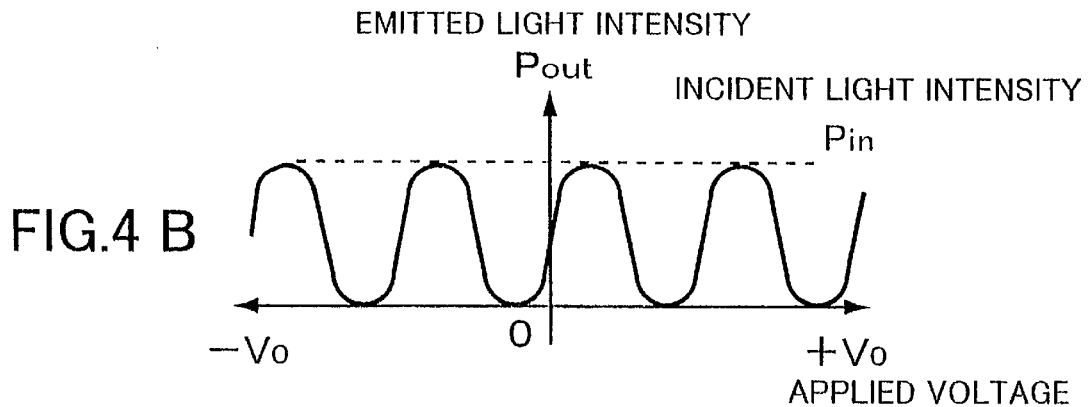

This will be described below with reference to FIGS. 3 and 4. Let the intensity of light incident on the input optical waveguide 54, the intensity of light for emission to the output optical waveguide 55 and the voltage to be applied to the electric field application electrodes 52-4 and 52-5 be represented by $P_{in}$, $P_{out}$ and $V_0$, respectively. With a change in the applied voltage $V_0$, the intensity $P_{out}$ of light which is emitted to the optical waveguide 55 varies along a Cos curve as depicted in FIG. 4A. That is, when the applied voltage $V_0$ is zero, $P_{out}=P_{in}$; when the applied voltage $V_0$ is gradually varies in the + direction or − direction, the quantity of light emitted gradually decreases along the Cos curve, and at a certain applied voltage the quantity of light emitted goes down to zero. With a further increase in the applied voltage $V_0$, the emitted light intensity Pout gradually increases along the Cos curve, and when a certain voltage is reached, the emitted light intensity $P_{out}$ goes to a 1, that is, $P_{out}=P_{in}$. With the subsequent change in the applied voltage $V_0$, the emitted light intensity $P_{out}$ presents an optical modulation characteristic that it goes up and down between 1 and 0.

Figure 5:
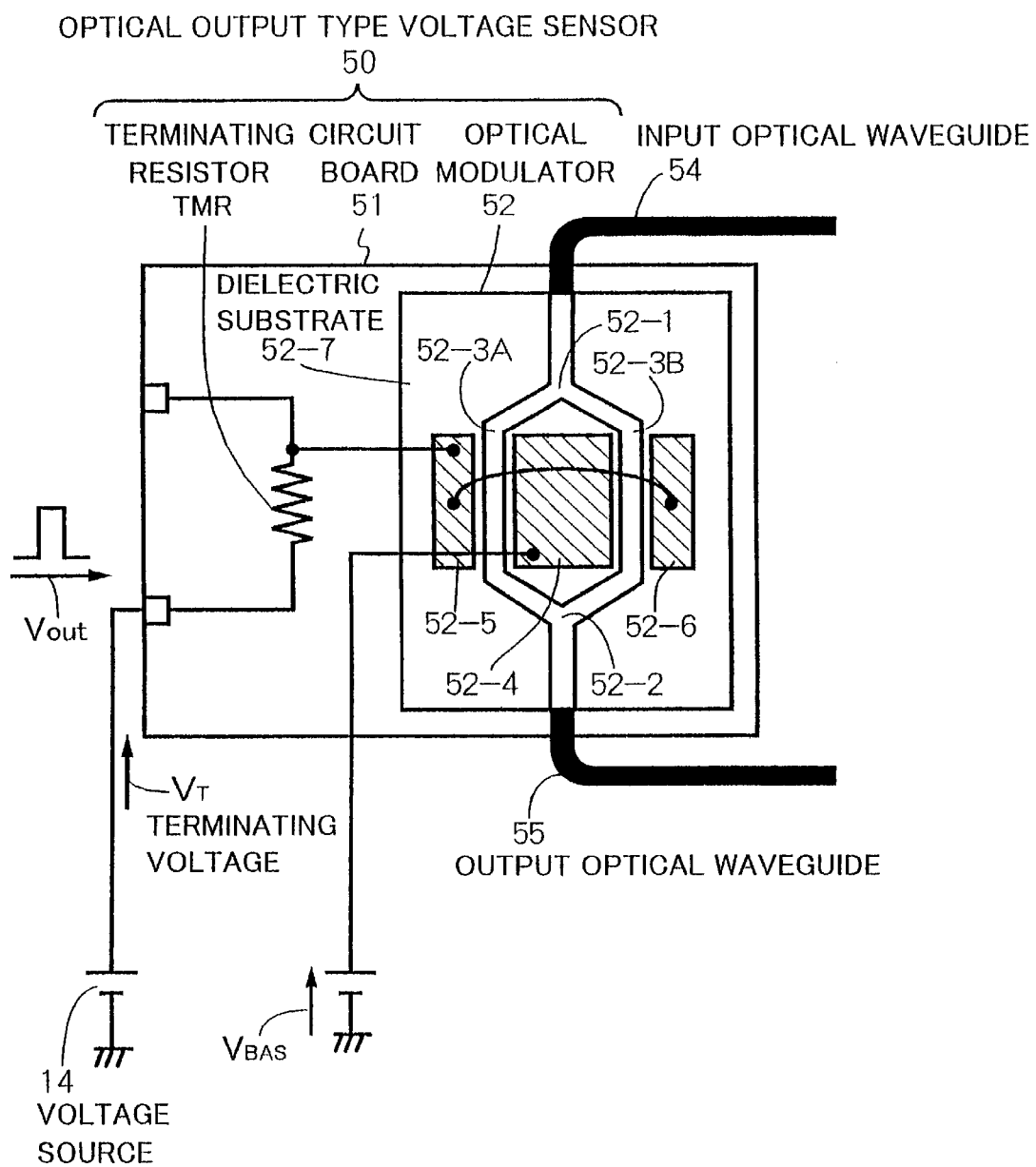
FIG. 5 is a plan view depicting an example of a concrete structure of the optical output type voltage sensor used in the embodiment of FIG. 2.

The optical modulation characteristic shown in FIG. 4A is in the case where the optical waveguide 52-3A and 52-3B have the same optical path length; when the optical path lengths differ by one quarter wavelength of the light which propagates over the both waveguides or when a bias voltage $V_{BAS}$ is applied to the electric field application electrodes connected as depicted in FIGS. 3 and 5, the optical modulation characteristic becomes such as shown in FIG. 4B wherein the emitted light intensity varies along the Sin curve with the change in the applied voltage $V_0$. That is, the emitted light intensity sharply varies about the applied voltage $V_{out}$=0. The following description on FIG. 6 et seq. will be given on the assumption that the optical modulator is initialized to such a state as depicted in FIG. 4B, by malting the optical path lengths of the optical waveguides 52-3A and 52-3B differ by one quarter wavelength.

As is evident from the modulation characteristic of the optical modulator 52 described above, the optical modulator 52 modulates the incident light to an optical signal such that the emitted light intensity $P_{out}$ assumes a value between $P_{out}=P_{in}$ and $P_{out}=0$, that is, between $P_{out}/P_{in}=1$ and $P_{out}/P_{in}=0$ in accordance with the applied electric field within a certain range (which keeps the phase modulation of light within a 360°-range). Hence, the detecting circuit 64 shown in FIG. 2 outputs the voltage signal $V_{out-1}$ (see FIG. 2) equivalent in waveform to the voltage signal $V_{out}$ output from the IC under test 10.

The process after the voltage signal $V_{out-1}$ is obtained is the same as in the case of the conventional IC testing apparatus; that is, the voltage signal $V_{out-1}$ is compared by a voltage comparator 13 with the H-logic level $V_{OH}$ and the L-logic level $V_{OL}$ to decide whether the voltage signal has a predetermined logic level; and if the decision result is good, the voltage comparison result and an expectation are subjected to a logical comparison to decide whether the operation of the IC under test 10 is normal or not. In FIG. 2 there is depicted the structure including the voltage comparator 13, there are not shown the logical comparator for comparing the voltage signal $V_{out-1}$ and the expectation to see if they match, and the pattern generator for generating the expectation, and so forth.

Incidentally, the sensitivity of the optical modulator 52 depicted in FIG. 3 for detecting the voltage signal $V_{out}$ is proportional to the electrode length L (see FIG. 3) and is inversely proportional to the electrode spacing. Accordingly, the detecting sensitivity for the voltage signal $V_{out}$ can be enhanced by increasing the electrode length L and decreasing the electrode spacing.

The sensitivity of the optical modulator 52 can be doubled by differentially applying the voltage signal $V_{out}$ from the IC under test 10 to the both pairs of electric field application electrodes 52-4, 525-5 and 52-4, 52-6 as depicted in FIG. 5. Another possible method for improving the sensitivity is to increase the intensity of light that is emitted from the light source 61.

At any rate, by converting the response signal Vout output from the IC under test 10 to an optical signal and sending the voltage signal Vout of the IC under test 10 as the optical signal from the test head THD to the mainframe MIN, the quality of the optical signal will not deteriorate even if the distance of transmission is somewhat long, for example, approximately tens of to one hundred meters. In addition, no electrically induced noise gets mixed into the optical signal from the outside nor is it affected by a parasitic capacitance, a parasitic inductor and so on unlike in the case of the electrical transmission line—this also ensures high-quality optical signal transmission. Furthermore, since the number of parts handling electric signals in the test head THD is small, the heat generation in the test head THD can be reduced. This suppresses the total amount of heat generated in the test head THD and hence prevents a temperature rise in the test head THD, bringing an advantage that such an expensive device as a cooling system can be dispensed with.

Figure 6:
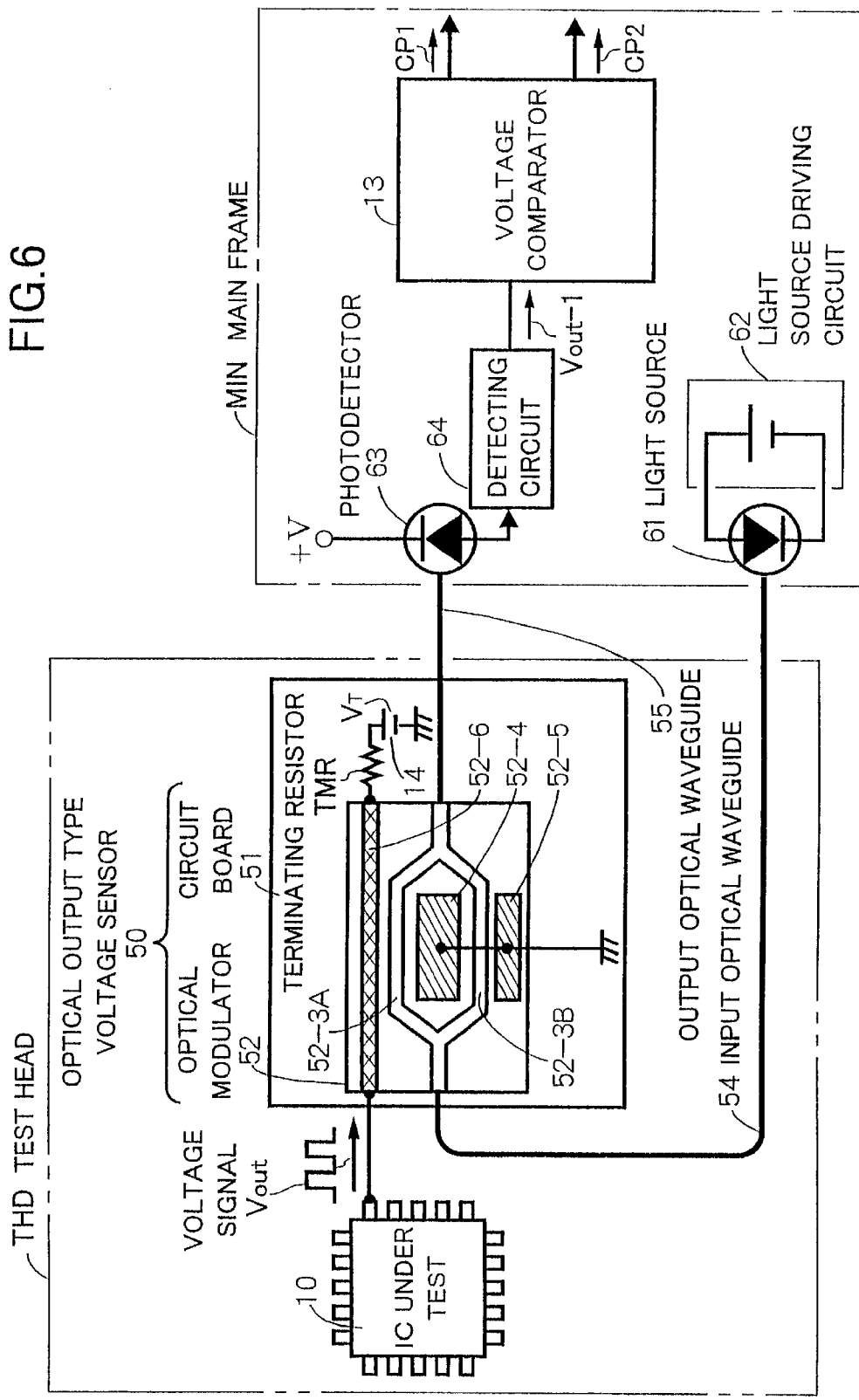
FIG. 6 is a connection diagram for explaining a modification of the optical output type voltage sensor according to the present invention as being applied to an IC testing apparatus.

FIG. 6 illustrates a modified form of the optical output type voltage sensor 50. In this embodiment, the electric field application electrode 52-6 forming the optical modulator 52 has a signal transmission line structure formed by a microstrip line matched to a predetermined characteristic impedance, and the electric field application electrode 52-6 of the signal transmission line structure is caused to propagate therethrough the voltage signal Vout that is output from the IC under test 10. The terminating resistor TMR and the voltage source 14 which outputs the terminating voltage VT are connected in series to the terminating end of the electric field application electrode 52-6 and are connected to a common potential point.

The optical waveguide 52-3B forming the optical modulator 52 transmits light in the same direction as that of propagation of the voltage signal $V_{out}$, and the light passing through the optical waveguide 52-3B is applied the voltage $V_0$ of the voltage signal $V_{out}$ between the electric field application electrodes 52-6 and 52-4. The electrodes 52-4 and 52-5 of the other electrode pair are kept equipotential and no electric field is applied to the optical waveguide 52-3B. The light source 61 in this example is shown to be lit DC-wise by a DC light source driving circuit.

By making the voltage signal $V_{out}$ and the light travel at the same velocity by making them travel in the same direction as in this embodiment, the optical modulator operates as a traveling-wave type optical modulator. As a result, the modulation characteristic of the optical modulator 52 is made wide-band, an the pulse signal $V_{out-1}$, which is reproduced by the interference light in the mainframe MIN faithfully reproduces the waveform of the voltage signal $V_{out}$ at the sending side. Moreover, since the voltage signal $V_{out}$ and the light travel at the same velocity, the voltage detecting sensitivity also provides a high gain.

Figure 7:
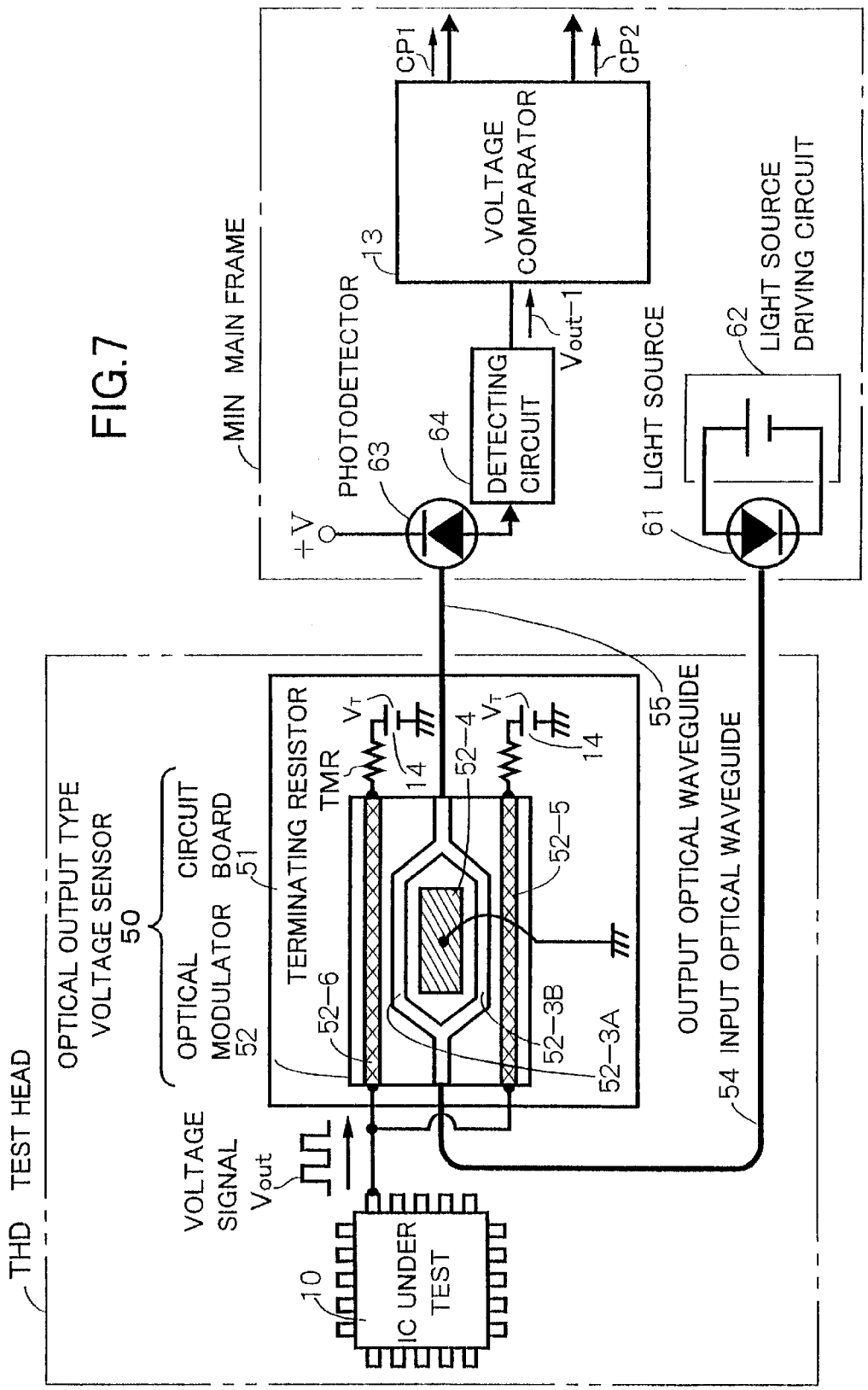
FIG. 7 is a connection diagram for explaining another modification of the optical output type voltage sensor according to the present invention as being applied to an IC testing apparatus.

FIG. 7 depicts a modification of the FIG. 6 embodiment. This embodiment shows a structure in which the electric field application field electrodes 52-2 and 52-3 are collected together and each have the signal transmission line structure with a view to differential application of an electric field to the optical waveguides 52-3A and 52-3B. In this instance, the impedances of the signal transmission lines formed by the electric field application electrodes 52-5 and 52-6 are set at about twice higher than in the case of FIG. 6, and the resistance value of the terminating resistor TMR is also twice higher than in the case of FIG. 6. With the structure of FIG. 7 it is possible to obtain an advantage that the voltage detecting sensitivity can be around twice higher than in the FIG. 6 embodiment.

Figure 8:
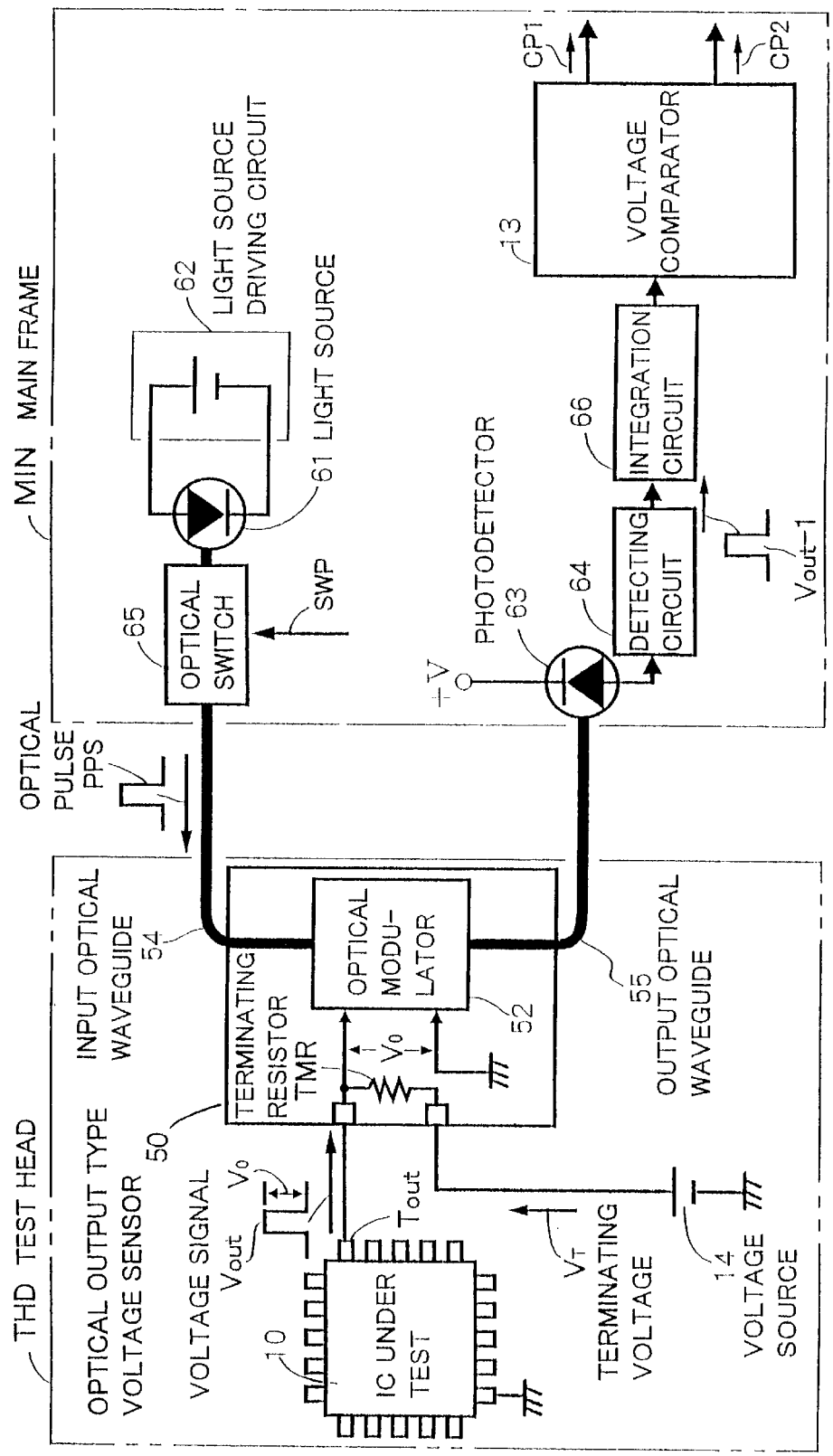
FIG. 8 is a connection diagram for explaining a modified form of the IC testing apparatus depicted in FIG. 2.

FIG. 8 illustrates a modified form of the embodiment shown in FIG. 2. In the embodiment of FIG. 8 an optical switch 65 is connected to the light source 61 side; the light emitted from the light source 61 is converted by the optical switch 65 to a narrow-width optical pulse PPS (see FIG. 9B), and the optical pulse PPS is provided via the input optical waveguide 54 to the optical modulator 52. The timing of for applying a switch control signal SWP to the optical switch 65 is chosen so that the optical pulse PPS is generated at the timing which the voltage signal $V_{out}$ from the IC under test 10 reaches a stable value. By the application of the optical pulse PPS at the predetermined timing of the voltage signal $V_{out}$, the pulse-shaped interference light that is provided from the optical modulator 52 has light interference levels that correspond to the H- and L-logic values of the voltage signal $V_{out}$. Accordingly, the detecting circuit 64 provides such a voltage signal $V_{out-1}$ as depicted in FIG. 9C. At the output side of the detecting circuit 64 there is placed an integration circuit 66, which integrates the output voltage signal $V_{out-1}$ from the detecting circuit 64.

The integration time constant of the integration circuit 66 is chosen to be large enough for the integrated voltage INTV to reach a target value within the duration of the optical pulse PPS. With such a chosen time constant of the integration circuit 66, it is possible to sufficiently detect the peak value of the voltage signal $V_{out-1}$ that is output from the detecting circuit 64. The voltage integration by the integration circuit 66 to the target value allows sufficient time to execute the subsequent processing. Therefore, it is possible to obtain an advantage that no fast-acting circuits are needed at the stages following the integration circuit 66.

That is, once the integration circuit 66 integrates the peak value $V_{out-1}$, it maintains the integrated voltage thereafter, so that the voltage comparators 13A and 13B need only to make the comparison of the integrated voltage INTV of the integration circuit 66 by strobe pulse STB (see FIG. 9E) at timing delayed by a time interval τ until the integrated voltage INTV becomes settled.

The comparison results CP1 and CP2 by the comparators 13A and 13B are shown hi FIGS. 9G and H. After the voltage comparison the integrated voltage INTV of the integration circuit 66 is reset by a reset pulse RSP depicted in FIG. 9F.

By sampling the voltage signal $V_{out}$ from the IC under test 10 with the optical pulse PPS as in the embodiment of FIG. 8, the voltage signal $V_{out}$ can be sampled with fine resolution in the time-base direction. That is, the value of the voltage signal $V_{out}$ within the range of the pulse width of the optical pulse PPS can be measured with accuracy; for example, even if the waveform of the voltage signal $V_{out}$ is dull at the leading and trailing edges as shown in FIG. 10, final logical voltage values $V_H$ and $V_L$ of the voltage signal $V_{out-1}$ can be sampled by applying the optical pulse PPS at the timing when the voltage signal $V_{out}$ reaches the final logical voltage values $V_H$ and $V_L$. When the voltage signal $V_{out}$ has a fixed repeating cycle, its waveform itself can be observed by sampling the voltage signal $V_{out}$ while shifting the timing for the application of the optical pulse little by little. Incidentally, while the voltage measuring method using the optical switch 65 in the embodiment of FIG. 8 has been described to be applied to the embodiment of FIG. 2, it will readily understood that it is applicable to the embodiments of FIGS. 6 and 7 as well.

FIG. 11 illustrates the case of applying the present invention to an input/output terminal $T_{IO}$ which serves both as an input terminal and as an output terminal of the IC under test 10. In this case, the test pattern signal is input into the IC under test 10 through utilization of both of the optical driver 20 and the optical output type voltage sensor 50 described previously with reference to FIGS. 1 and 6, respectively, and the voltage signal $V_{out}$ from the IC under test 10 is converted by the optical output type voltage sensor 50 to an optical signal, which is sent to the mainframe MIN through the output optical waveguide 55.

The electric field application electrode 52-6 forming the optical output type voltage sensor 50 has a signal transmission line structure such as a microstrip line, and the electric field application electrode 52-6 is electrically connected at one end to the input/output terminal $T_{IO}$ of the IC under test 10 and at the other end to the externally-connected electrode 26 of the optical driver 20.

In the case of applying the test pattern signal to the IC under test 10, the waveform generator FOM controls the light sources 33A, 33B and 33C of the optical signal converter 33 to light in accordance with test pattern data, and the light is fed via the optical waveguides 32A, 32B and 32C to the photoconductive elements 23A, 23B and 23C placed in the test head THD, thereby driving the optical driver 20.

While the test pattern signal is applied to the IC under test 10, the light sources 33A and 33B are controlled to blink. On the other hand, in the case of outputting the voltage signal $V_{out}$ from the IC under test 10, the light source 33C is lit to bring the photoconductive element 23C into conduction, and one end of the terminating resistor TMR is connected to the common potential point via the DC power supply 31C that outputs the terminating voltage $V_T$, thereby terminating the input/output terminal $T_{IO}$ of the IC under test 10 in a state in which it is matched to a predetermined impedance.

Figure 16:
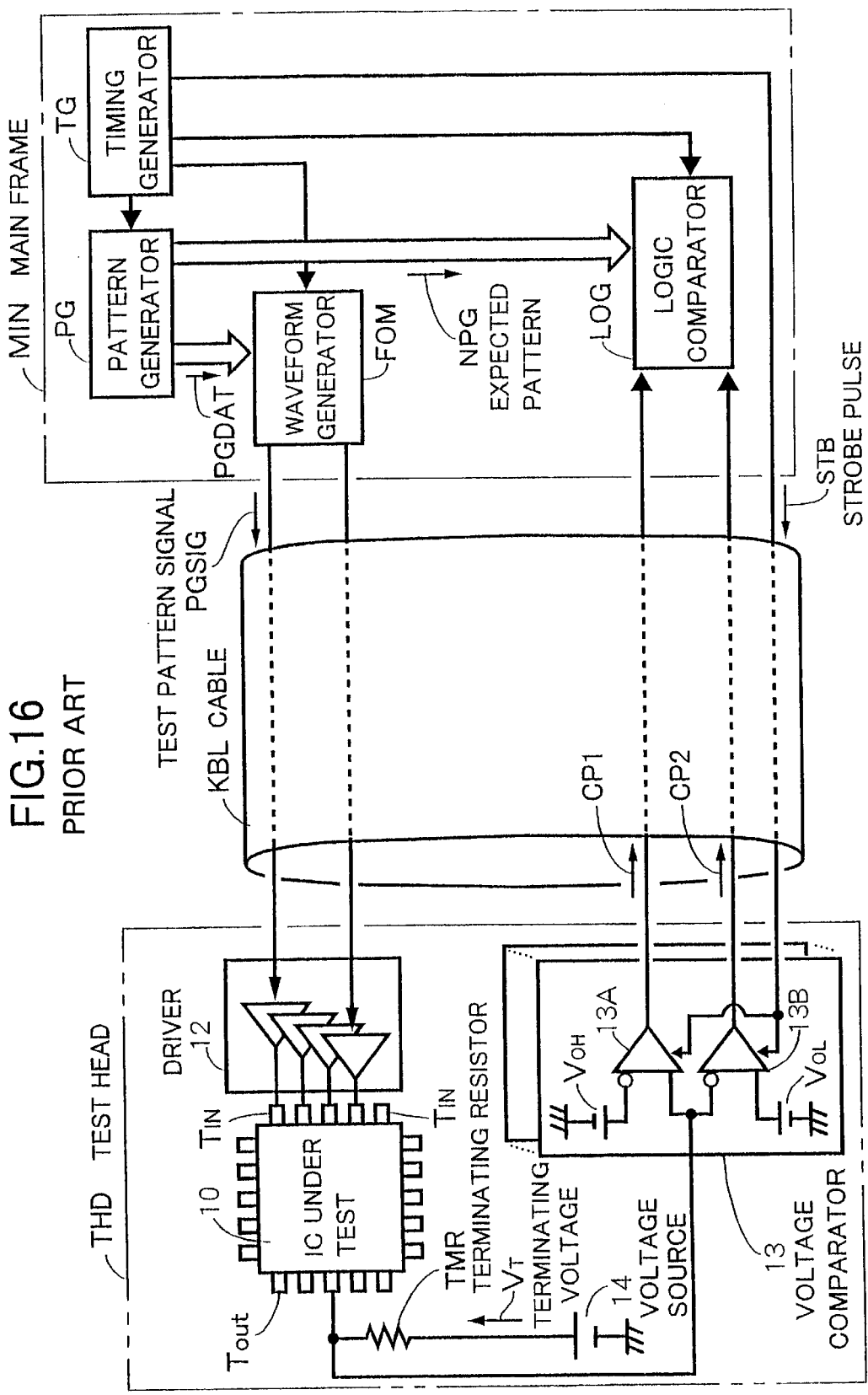
FIG. 16 is a block diagram for explaining the general electrical system of the conventional IC testing apparatus.
Figure 17:
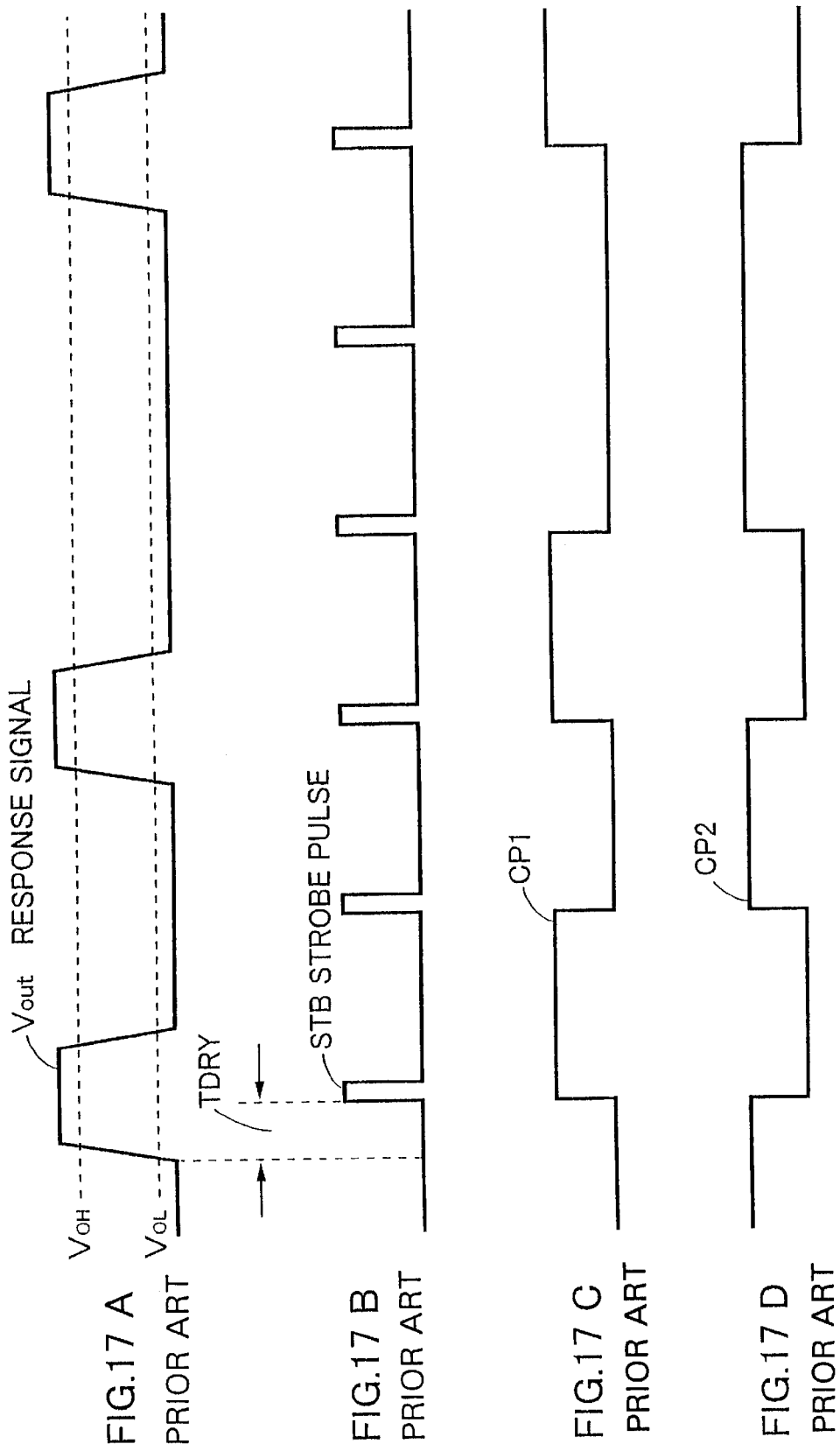
FIGS. 17A to 17B are waveform diagrams for explaining the operation of the FIG. 16 apparatus.
Figure 18:
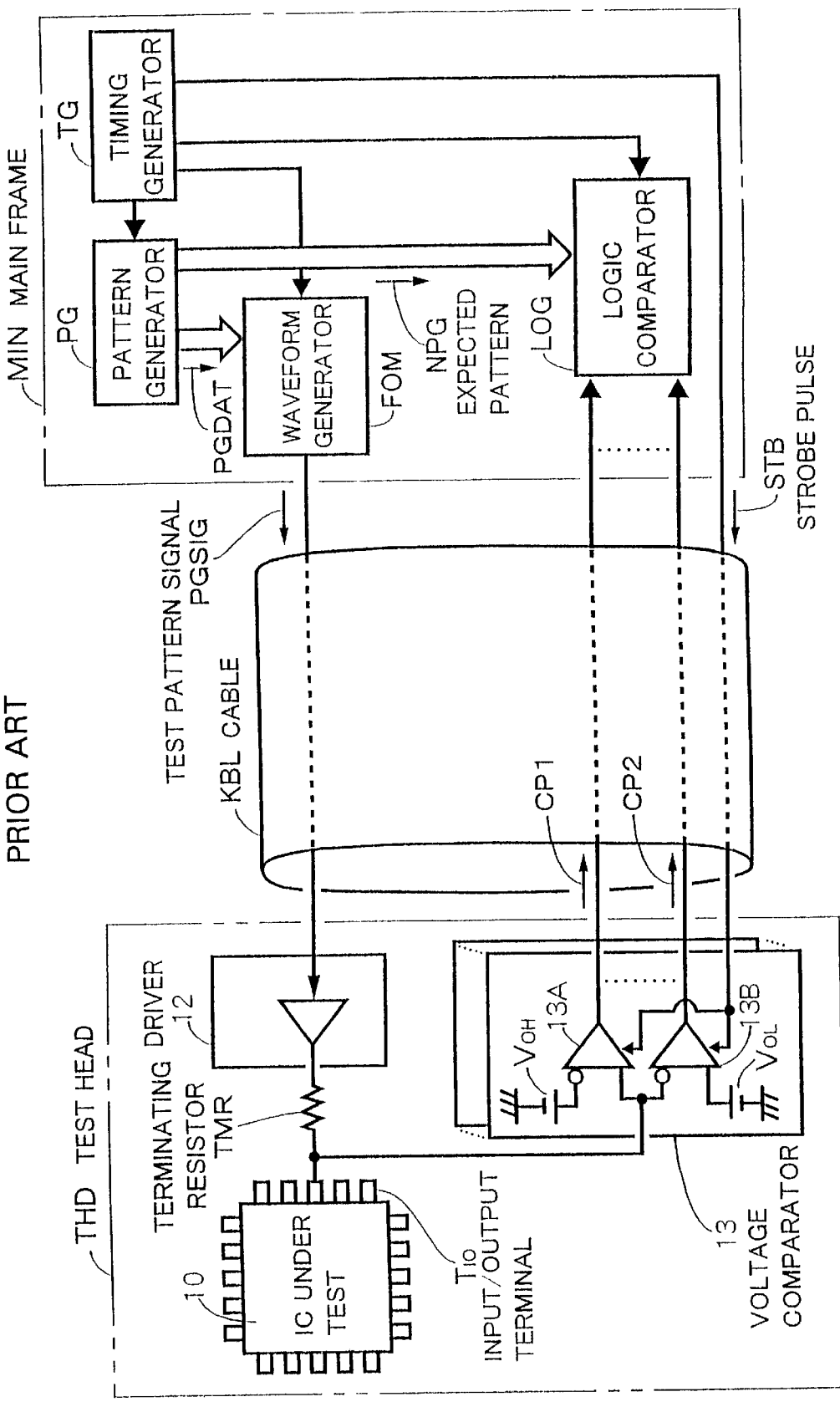
FIG. 18 is a block diagram for explaining another example of the conventional IC testing apparatus depicted in FIG. 16

When the IC under test 10 outputs the voltage signal $V_{out}$ in the terminated state, the phase of light passing through the optical modulator 52 is modulated by the voltage signal $V_{out}$, then interference light is generated in the coupling part due to the phase modulation of light, and the interference light is sent via the output optical waveguide 55 to the mainframe MIN, wherein it is converted by the photodetector 63 to an electric signal, and the detecting circuit 64 outputs the voltage signal $V_{out-1}$. The voltage signal $V_{out-1}$ is checked by the comparators 13A and 13B to decide whether it has the voltages of the H- mid L-logic levels, and the compared outputs CP1 and CP2 are fed into the logic comparator LOG (see FIG. 16) to determine whether the IC under test 10 is nondefective or defective.

While in the embodiment of FIG. 11 the light source 61 is shown to be lit DC-wise, it is also possible to employ such a configuration as depicted in FIG. 8 wherein the optical switch 65 is inserted in the optical waveguide 54, the light to be provided to the optical modulator is made pulse-shaped by the optical switch 65 and the voltage signal $V_{out}$ from the IC under test 10 is sampled by the optical pulse in the optical modulator 52.

Also the embodiment of FIG. 11 may adopt such a voltage sensor configuration as depicted in FIG. 12, wherein the electric field application electrodes 52-5 and 52-6 both have the microstrip line structure and the voltage signal $V_{out}$ is applied to each of them to differentially apply the electric field to the optical waveguides 52-3A and 52-3B, thereby providing doubled sensitivity for voltage detection.

Figure 13:
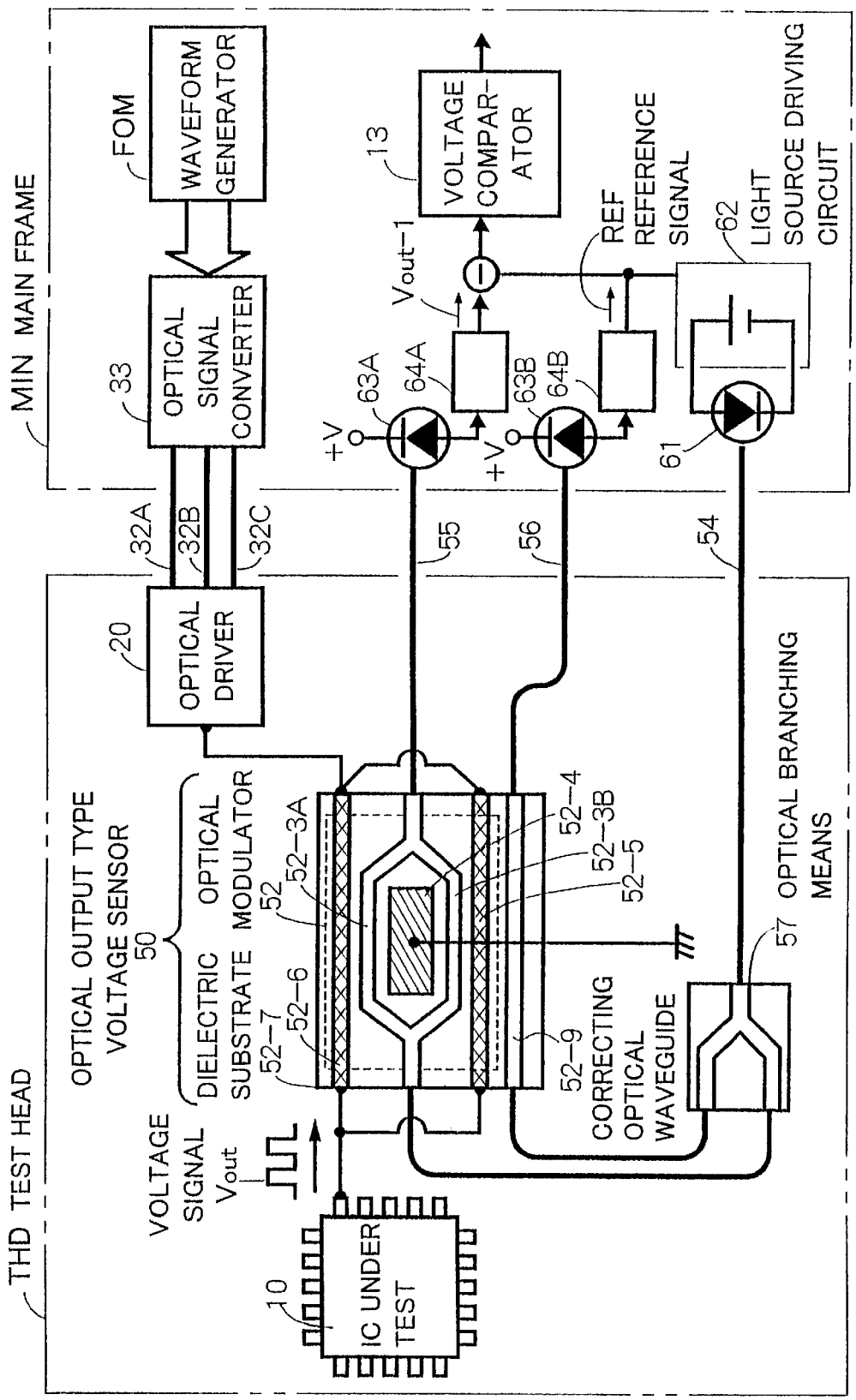
FIG. 13 is a connection diagram depicting another modification of the FIG. 11 embodiment.

FIG. 13 illustrates a modified form of the IC testing apparatus of the present invention depicted in FIG. 12. In the embodiment of FIG. 13, a correcting optical waveguide 52-9 is formed in the dielectric substrate 52-7; the correcting optical waveguide 52-9 transmits a portion of light to be provided to the optical modulator 52, and the transmitted light is fed via the optical waveguide 56 into the mainframe MIN, generating a reference signal REF by a photodetector 63B and a detecting circuit 64B placed in the mainframe MIN. The reference signal REF is subtracted from the voltage signal $V_{out-1}$ provided from the detecting circuit 64A, and at the same time the reference signal REF is applied to the light source driving circuit 62 to control the light source 61 to stabilize the intensity of light it emits.

According to the embodiment of FIG. 13, the intensity of light from the light source 61 is controlled to stabilize, and consequently, the intensity of light incident on the optical modulator 52 also stabilizes, providing increased reliability of the optical modulator 52. Furthermore, in this embodiment the correcting optical waveguide 52-9 is formed adjacent the optical modulator 52 and the light passing through the correcting optical waveguide 52-9 is used to generate the reference signal REF; therefore, even if the quantities of light transmitted through the optical waveguides 52-3A and 52-3B forming the optical modulator 52 vary, for example, due to a temperature change, the variation can be detected by a change in the reference signal, so that a variation in the voltage signal $V_{out-1}$ can be corrected by detecting the change in the reference signal REF.

Moreover, an offset component can be removed from the voltage signal $V_{out-1}$ by subtracting the reference signal REF from the voltage signal $V_{out-1}$.

Figure 14:
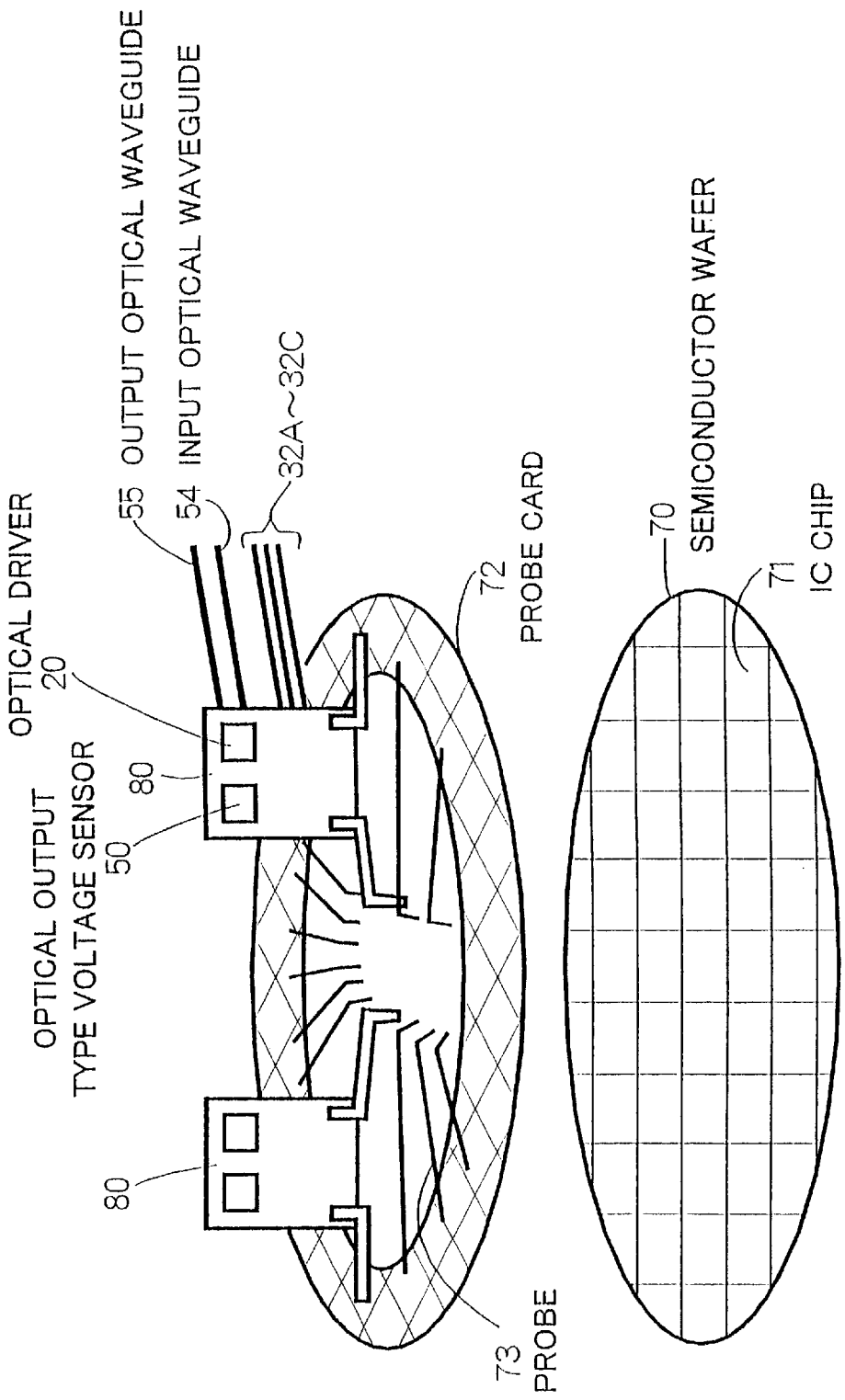
FIG. 14 is a perspective view illustrating still another modification of the FIG. 11 embodiment.
Figure 15:
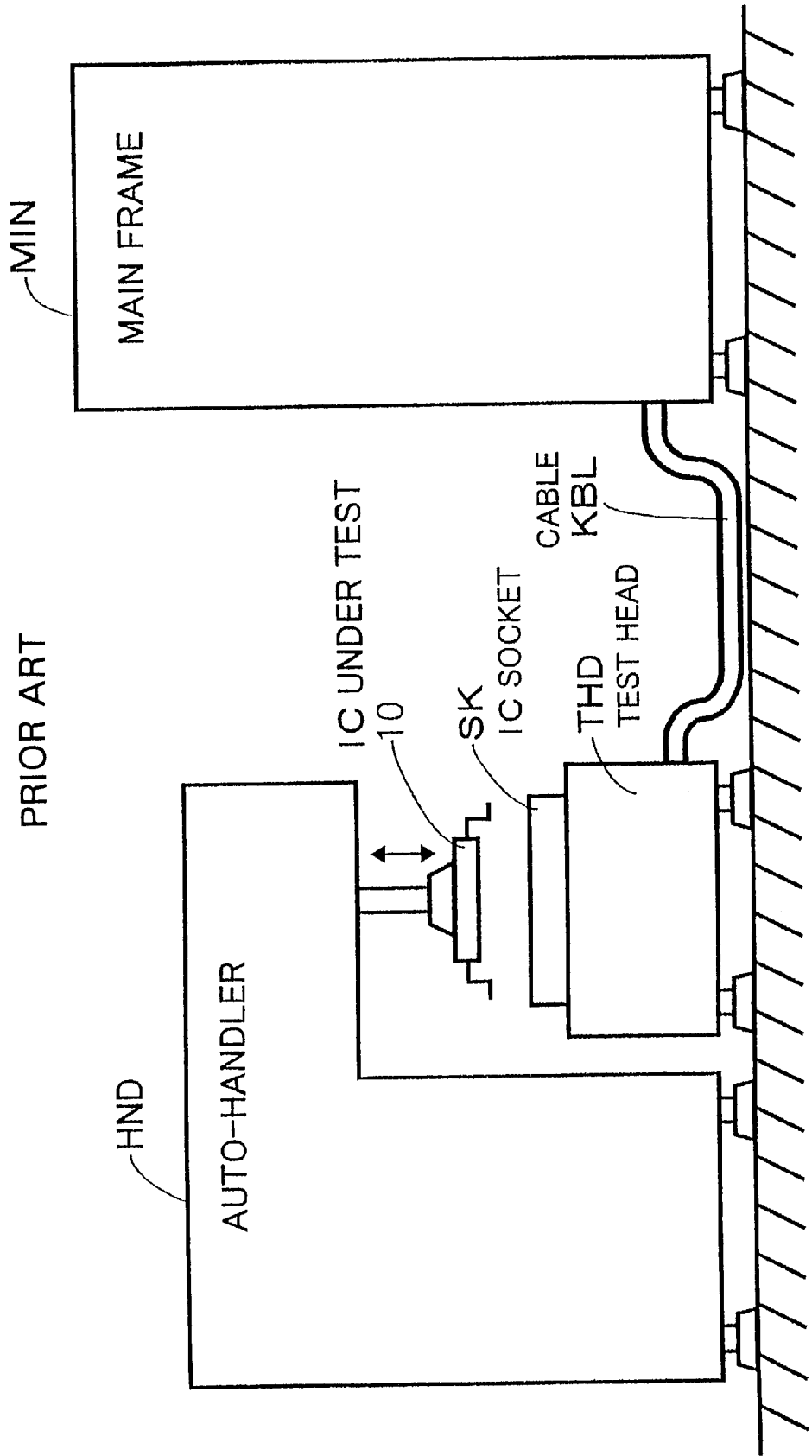
FIG. 15 is a diagram for explaining the general configuration of a conventional IC testing apparatus.

FIG. 14 illustrates still another embodiment. The embodiment of FIG. 14 shows the application of the optical driver 20 and the optical output type voltage sensor 50 of the present invention to the case where probes 73 are held in direct contact with IC chips 71 formed all over the surface of a semiconductor wafer 71 to test the ICs on the IC chips 71 for normal operation. A probe card 72 is usually formed in the form of a ring, and the probes 73 project at one end inwardly from the marginal edge of its center hole and are supported at the other end on the probe card 72. The tips of the probes 73 are each held in contact with an electrode portion formed on the IC chip 71, and the integrated circuit formed on the IC chip 71 is operated for testing.

In such an IC testing apparatus, a substrate 80 is prepared on which the optical driver 20 and the optical output type voltage sensor 50 are mounted together. The optical driver 20 and the optical output type voltage sensor 50 can be mounted together on a substrate of about 10 to 15 mm square. The substrate 80 is placed on each probe 73. The test pattern signal is applied via the probe 73 to the IC chip 71 from the optical driver 20, and at the same time the output signal $V_{out}$ from the IC chip 71 is taken out via the probe 73. The voltage signal $V_{out}$ is converted by the optical output type voltage sensor 50 to interference light for application to the mainframe through the output optical waveguide 55.

INDUSTRIAL APPLICABILITY

As described above, it is possible, with the use of the optical driver and the optical output type voltage sensor according to the present invention, to transmit the drive signal as an optical signal and the measured signal as an optical signal, too. The optical waveguides over which to transmit the optical signals are completely free from the possibility of electro-magnetically induced noise or similar electrical noise getting mixed thereinto as in the case of an electric signal transmission line and have no components such as a parasitic capacitance and a parasitic inductor; hence, no trouble occurs even if the signal transmission lines are made long.

Accordingly, by the application of the optical driver and the optical output type voltage sensor of the present invention to the IC testing apparatus, the test pattern signal can be applied to the IC under test 1 without being subjected to an electrical disturbance even if the distance between the test head THD and the mainframe MIN is long, because signals are transmitted therebetween as optical signals. Furthermore, the voltage signal Vout from the IC under test 10 can be sent into the mainframe MIN without deteriorating its waveform.

In addition, since there is not present in the signal transmission line such components as a parasitic capacitance or a parasitic inductor, the frequency of the optical signal which propagates through the optical waveguide can also be set high. As the result of this, the frequency of the test pattern signal to be applied to the IC under test 10 can also be set at a frequency sufficiently higher than in the case of an electric signal. This speeds up the testing of the IC under test 10, providing the advantage of dramatically increasing the test speed of the IC testing apparatus.

Moreover, since the optical driver 20 and the optical output type voltage sensor 50 do not use any electronic active elements that consumes power in quantities, the heat generation is close to zero. Accordingly, even if large numbers of optical drivers 20 and the optical output type voltage sensors 50 are mounted in the test head THD, the calorific value is so slight that there is no particular need for using a cooling device. Hence, reduction of the manufacturing costs of the IC testing apparatus can be expected.

What is claimed is:

1. An optical driver, comprising:
    a plurality of optical waveguides;
    a plurality of photoconductive elements optically coupled to the plurality of optical waveguides at one end thereof;
    a plurality of direct current (DC) voltage sources connected to the photoconductive elements at one end thereof;
    an output terminal connected in common to the other ends of said photoconductive elements; and
    a terminating resistor formed between the output terminal and an externally-connected electrode through which an electrical test pattern signal is provided.

2. The optical driver as claimed in claim 1, wherein said plurality of DC voltage sources are each provided with:
    two DC voltage sources for generating two voltages which define H- and L-logic voltages of a test pattern signal to be applied to an IC under test; and
    a voltage source for generating a terminating voltage which is determined by the specifications of the IC under test.

3. An integrated circuit (IC) testing apparatus comprising:
    an optical test pattern generator that converts a test pattern signal received from a waveform generator into an optical test pattern signal;
    an optical driver optically coupled to said optical test pattern generator, wherein said optical driver converts the optical test pattern signal into an electric test pattern signal that represents the test pattern signal received from the waveform generator;
    a socket adapted to receive an IC for testing, wherein said socket is coupled to the optical driver to receive the electrical test pattern signal, applies said electrical test pattern signal to said IC for testing, and receives an IC test-response signal from said IC for testing in response to said electrical test pattern signal;
    an optical output type voltage sensor optically coupled to a light source and electrically coupled to the socket, wherein the optical output type voltage sensor generates interference light in response to the IC test-response signal and input light received from the light source; and
    a target photodetector optically coupled to the optical output type voltage sensor, wherein the target photodetector generates an electric output signal responsive to the interference light, and the electrical output signal is subjected to a logical comparison with an expected pattern signal to determine whether the IC is defective.

4. The apparatus as claimed in claim 3 that comprises:
a mainframe having
   a pattern generator that outputs test pattern data and the expected pattern signal,
   the waveform generator coupled to the pattern generator that generates the test pattern signal in response to the test pattern data received from the pattern generator,
   the optical test pattern generator;
   the target photodector, and
   a logic comparator coupled to the target photodector and the pattern generator to make the logical comparison of the IC test-response signal with the expected pattern signal received from said pattern generator;
a test head spaced apart from the mainframe, the test head having
   the optical driver,
   the optical output type voltage sensor, and
   the IC socket; and
an optical waveguide optically coupling the optical test pattern generator, and the optical driver.

5. The apparatus as claimed in claim 3 or 4 comprising:
an input optical waveguide optically coupling the light source and the optical output voltage sensor; and
an output optical waveguide optically coupling the optical output voltage sensor and the target photodetector.

6. The apparatus as claimed in claim 3 or 4 that comprises a correcting optical waveguide formed adjacent an optical modulator forming said optical output type voltage sensor, wherein the correcting optical wave guide transmits a portion of light to be applied to said optical modulator, the light transmitted through the correcting optical waveguide is converted into a reference signal, the reference signal is computed with an electric signal generated by the interference light from said optical output type voltage sensor and is taken as the response signal from the IC for testing.

7. The apparatus as claimed in claim 3 or 4 that comprises a correcting optical waveguide formed adjacent to an optical modulator forming said optical output type voltage sensor, wherein the correcting optical waveguide transmits a portion of light to be applied to said optical modulator, the light transmitted through the correcting optical waveguide is converted into a reference signal, and the reference signal is fed back to stabilize the output intensity of the light source.

8. The apparatus as claimed in claim 4 wherein a probe card is mounted in said test head, said optical driver and said optical output type voltage sensor are mounted on each of a plurality of probes projecting out from the probe card but supported at one end thereto, and said probes are each held in contact with a terminal portion of an IC chip formed on a semiconductor wafer.

9. The apparatus as claimed in claim 3 or 4, wherein the optical driver comprises:
   a plurality of optical waveguides;
   a plurality of photoconductive elements optically coupled to the plurality of optical waveguides at one end thereof;
   a plurality of direct current (DC) voltage sources connected to the photoconductive elements at one end thereof;
   an output terminal connected in common to the other ends of said photoconductive elements; and
   a terminating resistor formed between the output terminal and an externally-connected electrode through which the electrical test pattern signal is provided.

10. The apparatus as claimed in claim 9, wherein said plurality of DC voltage sources are each provided with:
   two DC voltage sources for generating two voltages which define H- and L-logic voltages of a test pattern signal to be applied to the IC for testing; and
   a voltage source for generating a terminating voltage which is determined by the specifications of the IC for testing.

11. The apparatus as claimed in claim 3 or 4, wherein the optical output type voltage sensor comprises an interferomatic optical modulator that comprises:
   an optical branching part that is optically coupled to the light source,
   an optical coupling part,
   first and second optical waveguides formed between the optical branching part and the optical coupling part, and
   a first electrode, a second electrode and a common electrode arranged such that the first electrode and the common electrode are disposed as a first electrode pair along opposite sides of the first optical waveguide, and the second electrode and the common electrode are disposed as a second electrode pair along opposite sides of the second optical waveguide, wherein the first and second electrodes are connected together to form parallel-connected electrodes and the IC test-response signal is applied across the parallel-connected electrodes and the common electrode, whereby the light output from said coupling part is made interference light in response to the IC test-response signal.

12. The apparatus as claimed in claim 11, wherein the input light comprises an optical pulse.

13. The apparatus as claimed in claim 11, wherein the first and second electrodes connected together each have a signal transmission line structure of a predetermined impedance and the IC test-response signal passes through the first and second electrodes of the transmission line structures in the same direction as the light passes through said optical first and second waveguides.

14. The apparatus as claimed in claim 3 or 4, wherein the optical output type voltage sensor comprises an interferomatic optical modulator that comprises:
   an optical branching part that is optically coupled to the light source,
   an optical coupling part,
   first and second optical waveguides formed between the optical branching part and the optical coupling part, and
   a first electrode, a second electrode and a common electrode arranged such that the first electrode and the common electrode are disposed as a first electrode pair along opposite sides of the first optical waveguide, and the second electrode and the common electrode are disposed as a second electrode pair along opposite sides of the second optical waveguide, wherein the second electrode is connected to the common electrode and the IC test-response signal is applied across the first electrode and the common electrode, whereby the light output from said coupling part is made interference light in response to the IC test-response signal.

15. The apparatus as claimed in claim 14, wherein the input light comprises an optical pulse.

16. The apparatus as claimed in claim 14, wherein the first electrode has a signal transmission line structure of a predetermined impedance and the IC test-response signal passes through the first electrode of the transmission line structure in the same direction that the light passes through said first optical waveguide.

17. A method of testing an integrated circuit (IC); said method using an optical driver that includes a plurality of optical waveguides, a plurality of photoconductive elements optically coupled to the plurality of optical waveguides at one end thereof, a plurality of direct current (DC) voltage sources connected to the photoconductive elements at one end thereof, an output terminal connected in common to the other ends of said photoconductive elements, and a terminating resistor formed between the output terminal and an externally-connected electrode; said method comprising:

converting a test pattern signal into an optical test pattern signal;

receiving the optical test pattern signal and using the optical driver to generate an electrical test pattern signal in response thereto;

applying said electrical test pattern signal to an IC;

comparing a response of said IC to an expected response; and determining, responsive to said comparing, whether said IC is defective.

* * * * *